United States Patent
Zhang (10) Patent No.: US 10,490,562 B2
(45) Date of Patent: Nov. 26, 2019

(54) THREE-DIMENSIONAL VERTICAL ONE-TIME-PROGRAMMABLE MEMORY COMPRISING MULTIPLE ANTIFUSE SUB-LAYERS

(71) Applicant: Guobiao Zhang, Corvallis, OR (US)

(72) Inventor: Guobiao Zhang, Corvallis, OR (US)

(73) Assignees: HangZhou HaiCun Information Technology Co., Ltd., HangZhou, ZheJiang (CN); Guobiao Zhang, Corvallis, OR (US)

(*) Notice: Subject to any disclaimer, the term of this patent is extended or adjusted under 35 U.S.C. 154(b) by 0 days.

(21) Appl. No.: 15/919,381

(22) Filed: Mar. 13, 2018

(65) Prior Publication Data
US 2018/0204844 A1  Jul. 19, 2018

Related U.S. Application Data

(63) Continuation-in-part of application No. 15/488,489, filed on Apr. 16, 2017, now Pat. No. 10,002,872.

(30) Foreign Application Priority Data

| Apr. 16, 2016 | (CN) | 2016 1 0234999 |
| Jan. 10, 2018 | (CN) | 2018 1 0024499 |
| Jan. 17, 2018 | (CN) | 2018 1 0045347 |

(51) Int. Cl.
| *H01L 27/112* | (2006.01) |
| *H01L 23/525* | (2006.01) |
| *H01L 27/06* | (2006.01) |
| *G11C 17/16* | (2006.01) |
| *H01L 27/24* | (2006.01) |
| *H01L 29/66* | (2006.01) |

(52) U.S. Cl.
CPC ........ *H01L 27/11206* (2013.01); *G11C 17/16* (2013.01); *H01L 23/5252* (2013.01); *H01L 27/0688* (2013.01); *H01L 27/2454* (2013.01); *H01L 29/66143* (2013.01)

(58) Field of Classification Search
CPC ........... H01L 27/11206; H01L 27/0688; H01L 27/2454; H01L 27/1128; H01L 27/11514; H01L 27/11597; H01L 23/5252; H01L 29/66143; H01L 29/782; H01L 45/04; H01L 45/06; H01L 45/08; H01L 45/1675; H01L 2924/12032; G11C 17/16; G11C 17/165; G11C 13/0004; G11C 13/0007
See application file for complete search history.

(56) References Cited

U.S. PATENT DOCUMENTS

| 4,404,655 A | 9/1983 | Naiff |
| 4,424,579 A | 1/1984 | Roesner |
| 4,598,386 A | 7/1986 | Roesner et al. |
| 4,603,341 A | 7/1986 | Bertin et al. |

(Continued)

*Primary Examiner* — Michael M Trinh (57) ABSTRACT

The present invention discloses a three-dimensional vertical one-time-programmable memory (3D-OTP$_V$). It comprises horizontal address lines and memory holes there-through, an antifuse layer and vertical address lines in said memory holes. The antifuse layer comprises at least first and second sub-layers with different antifuse materials. The 3D-OTP$_V$ comprises no separate diode layer.

11 Claims, 10 Drawing Sheets

(56) References Cited

U.S. PATENT DOCUMENTS

| | | | |
|---|---|---|---|
| 4,646,266 A | 2/1987 | Ovshinsky et al. | |
| 4,796,074 A | 1/1989 | Roesner | |
| 4,939,568 A | 7/1990 | Kato et al. | |
| 5,257,224 A | 10/1993 | Nojiri et al. | |
| 5,272,370 A | 12/1993 | French | |
| 5,375,085 A | 12/1994 | Gnade et al. | |
| 5,455,435 A | 10/1995 | Fu et al. | |
| 5,468,983 A | 11/1995 | Hirase et al. | |
| 5,721,169 A | 2/1998 | Lee | |
| 5,751,012 A | 5/1998 | Wolstenholme et al. | |
| 5,825,686 A | 10/1998 | Schmitt-Landsiedel et al. | |
| 5,835,396 A * | 11/1998 | Zhang | G11C 17/12 365/51 |
| 5,838,530 A | 11/1998 | Zhang | |
| 5,841,150 A | 11/1998 | Gonzalez et al. | |
| 5,843,824 A | 12/1998 | Chou et al. | |
| 5,847,442 A | 12/1998 | Mills, Jr. et al. | |
| 5,854,111 A | 12/1998 | Wen | |
| 5,904,526 A | 5/1999 | Wen et al. | |
| 5,907,778 A | 5/1999 | Chou et al. | |
| 5,943,255 A | 8/1999 | Kutter et al. | |
| 6,015,738 A | 1/2000 | Levy et al. | |
| 6,021,079 A | 2/2000 | Worley | |
| 6,034,882 A | 3/2000 | Johnson et al. | |
| 6,049,481 A | 4/2000 | Yamasaki | |
| 6,055,180 A | 4/2000 | Gudesen et al. | |
| 6,185,122 B1 | 2/2001 | Johnson et al. | |
| 6,221,723 B1 | 4/2001 | Kunitou | |
| 6,236,587 B1 | 5/2001 | Gudesen et al. | |
| 6,380,597 B1 | 4/2002 | Gudesen et al. | |
| 6,603,187 B1 * | 8/2003 | Zhang | H01L 23/5252 257/530 |
| 6,624,485 B2 | 9/2003 | Johnson | |
| 6,717,222 B2 | 4/2004 | Zhang | |
| 7,442,997 B2 * | 10/2008 | Zhang | G11C 5/063 257/183 |
| 8,981,524 B2 * | 3/2015 | Tajima | H01L 27/101 257/50 |
| 2011/0065272 A1 * | 3/2011 | Mizukami | H01L 23/5226 438/637 |
| 2017/0148851 A1 * | 5/2017 | Hsu | H01L 27/11514 |

* cited by examiner

THREE-DIMENSIONAL VERTICAL ONE-TIME-PROGRAMMABLE MEMORY COMPRISING MULTIPLE ANTIFUSE SUB-LAYERS

CROSS-REFERENCE TO RELATED APPLICATIONS

This application is a continuation-in-part of "Three-Dimensional Vertical One-Time-Programmable Memory", application Ser. No. 15/488,489, filed on Apr. 16, 2017, now U.S. Pat. No. 10,002,872, which claims priority from Chinese Patent Application 201610234999.5, filed on Apr. 16, 2016, in the State Intellectual Property Office of the People's Republic of China (CN), the disclosure of which is incorporated herein by reference in its entirety.

This application also claims priority from Chinese Patent Application 201810024499.8, filed on Jan. 10, 2018; Chinese Patent Application 20181045347.6, filed on Jan. 17, 2018; in the State Intellectual Property Office of the People's Republic of China (CN), the disclosure of which are incorporated herein by references in their entireties.

BACKGROUND

1. Technical Field of the Invention

The present invention relates to the field of integrated circuit, and more particularly to one-time-programmable memory (OTP).

2. Prior Art

Three-dimensional (3-D) one-time-programmable memory (3D-OTP) is a monolithic semiconductor memory. It comprises a plurality of vertically stacked OTP cells. In a conventional OTP, the OTP cells are formed on a two-dimensional (2-D) plane (i.e. on a semiconductor substrate). In contrast, the OTP cells of the 3D-OTP are formed in a three-dimensional (3-D) space. 3D-OPT has a large storage density and a low storage cost.

U.S. patent application Ser. No. 15/360,895 filed by Hsu on Nov. 23, 2016 discloses a 3-D vertical memory including a 3D-OTP. It comprises a plurality of horizontal address lines vertically stacked above each other, a plurality of memory holes penetrating the horizontal address lines, an antifuse layer and a selector layer covering the sidewall of each memory hole, and a plurality of vertical address lines formed in the memory holes. It should be noted that the selector (or, selector layer) is also referred to as diode (or, diode layer), steering element, quasi-conduction layer, or other names in other patents and patent applications. All of them belong to a broad class of diode-like devices whose resistance at the read voltage (i.e. the read resistance) is substantially lower than when the applied voltage has a magnitude smaller than or a polarity opposite to that of the read voltage. Throughout this specification, "diode" is used to represent this class of devices and it is equivalent to selector, steering element, quasi-conduction layer and other names used in other patents and patent applications.

The 3-D vertical memory of Hsu uses a cross-point array. In order to minimize cross-talk between memory cells, the memory cell of Hsu comprises a separate diode layer (i.e. selector in Hsu). A good-quality diode layer is generally thick. For example, a P-N thin-film diode with a good rectifying ratio is at least 100 nm thick. To form a diode layer with such a thickness in the memory hole, the diameter of the memory hole has to be large, i.e. >200 nm. This leads to a lower storage density.

OBJECTS AND ADVANTAGES

It is a principle object of the present invention to provide a 3D-OTP with a large storage capacity.

It is a further object of the present invention to simplify the manufacturing process inside the memory holes.

It is a further object of the present invention to minimize the size of the memory holes.

It is a further object of the present invention to provide a properly working 3D-OTP even with leaky OTP cells.

In accordance with these and other objects of the present invention, the present invention discloses a three-dimensional vertical one-time-programmable memory (3D-OTP$_V$) comprising multiple antifuse sub-layers.

SUMMARY OF THE INVENTION

The present invention first discloses a three-dimensional vertical one-time-programmable memory (3D-OTP$_V$) comprising no separate diode layer. It comprises a plurality of vertical OTP strings formed side-by-side on the substrate circuit. Each OTP string is vertical to the substrate and comprises a plurality of vertically stacked OTP cells. To be more specific, the 3D-OTP$_V$ comprises a plurality of vertically stacked horizontal address lines (sometimes referred to as word lines). After the memory holes penetrating these horizontal address lines are formed, the sidewall of each memory hole is covered with an antifuse layer before the memory hole is filled with at least a conductive material. The conductive material in each memory hole forms a vertical address line (sometimes referred to as bit line). The OTP cells are formed at the intersections of the word lines and the bit lines.

To minimize the size of the memory holes, the preferred OTP cell of the present invention comprises no separate diode layer. Without separate diode layer, fewer layers (two instead of three) are formed inside the memory holes and its manufacturing process becomes simpler. In addition, smaller memory holes leads to a larger storage density.

In the preferred OTP cell of the present invention, a diode is formed naturally between the horizontal and vertical address lines. This naturally formed diode, referred to a built-in diode, generally has a poor quality and is leaky. To address this issue, the present invention discloses a full-read mode. For the full-read mode, all OTP cells on a selected word line are read out during a read cycle. The read cycle includes two read phases: a pre-charge phase and a read-out phase. During the pre-charge phase, all address lines (including all word and all bit lines) in an OTP array are charged to a pre-determined voltage. During the read-out phase, after its voltage is raised to the read voltage $V_R$, a selected word line starts to charge all bit lines through the associated OTP cells. By measuring the voltage change on the bit lines, the states of the associated OTP cells can be determined.

Accordingly, the present invention discloses a three-dimensional vertical one-time-programmable memory (3D-OTP$_V$), comprising: a semiconductor substrate comprising a substrate circuit; a plurality of vertically stacked horizontal address lines above said semiconductor circuit; a plurality of memory holes through said horizontal address lines; an antifuse layer on the sidewalls of said memory holes, said antifuse layer comprising at least first and second sub-layers, wherein said first and second sub-layers comprise different antifuse materials; a plurality of vertical address lines in said memory holes; a plurality of OTP cells at the intersections of said horizontal address lines and said vertical address lines.

It should be noted that all the drawings are schematic and not drawn to scale. Relative dimensions and proportions of parts of the device structures in the figures have been shown exaggerated or reduced in size for the sake of clarity and convenience in the drawings. The same reference symbols are generally used to refer to corresponding or similar features in the different embodiments. The symbol "/" means a relationship of "and" or "or".

Throughout the present invention, the phrase "on the substrate" means the active elements of a circuit are formed on the surface of the substrate, although the interconnects between these active elements are formed above the substrate and do not touch the substrate; the phrase "above the substrate" means the active elements are formed above the substrate and do not touch the substrate.

DETAILED DESCRIPTION OF THE PREFERRED EMBODIMENTS

Those of ordinary skills in the art will realize that the following description of the present invention is illustrative only and is not intended to be in any way limiting. Other embodiments of the invention will readily suggest themselves to such skilled persons from an examination of the within disclosure.

Figure 1A:
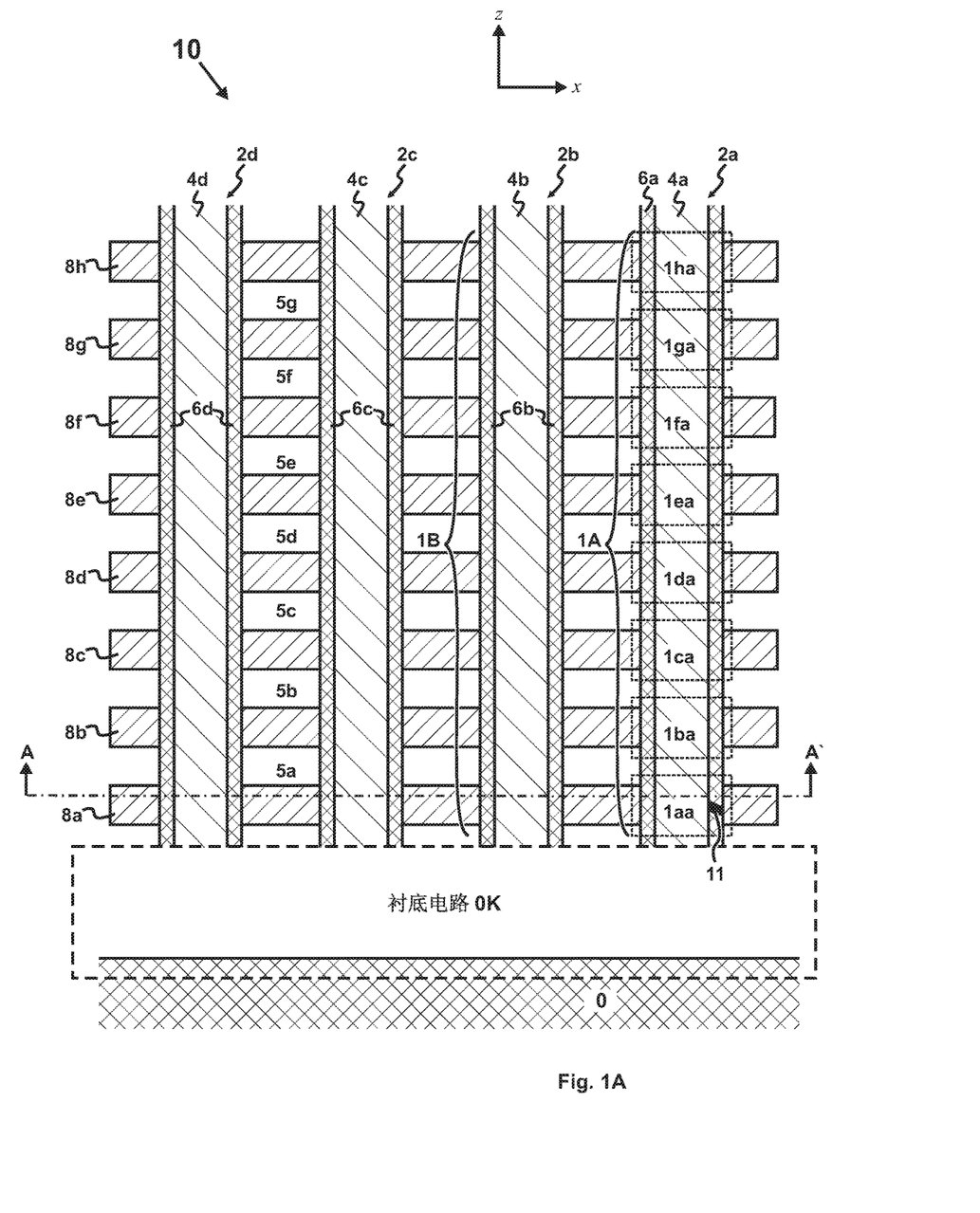
FIG. 1A is a z-x cross-sectional view of a first preferred 3D-OTP$_V$.
Figure 1B:
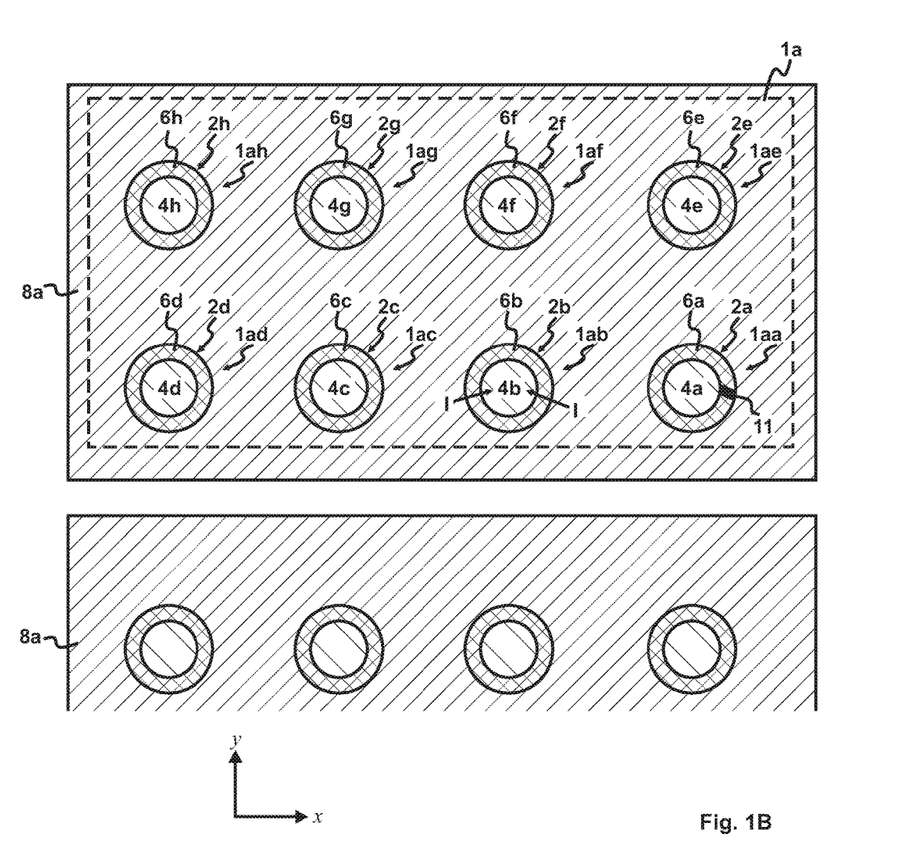
FIG. 1B is its x-y cross-sectional view along the cutline AA'.
Figure 1C:
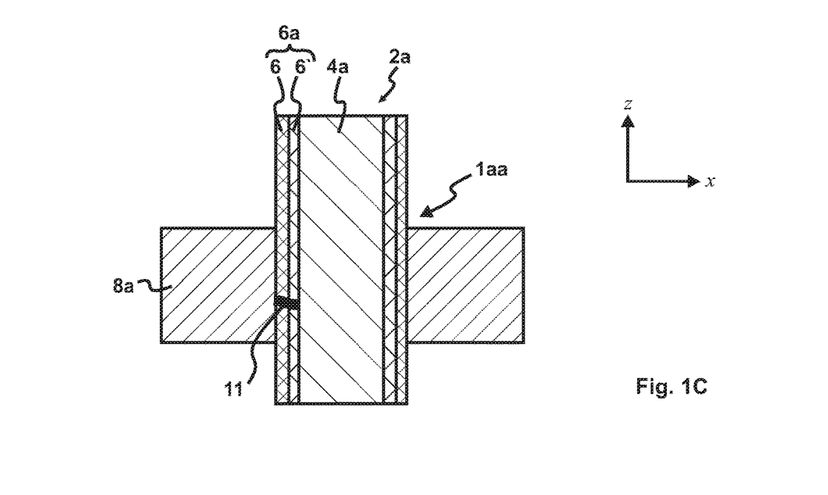
FIG. 1C is a z-x cross-sectional view of a preferred OTP cell.

Referring now to FIG. 1A-1C, a first preferred three-dimensional vertical one-time-programmable memory (3D-OTP$_V$) comprising no separate diode layer is disclosed. It comprises a plurality of vertical OTP strings 1A, 1B . . . (referred to as OTP strings) formed side-by-side on the substrate circuit 0K. Each OTP string (e.g. 1A) is vertical to the substrate 0 and comprises a plurality of vertically stacked OTP cells 1aa-1ha.

The preferred embodiment shown in this figure is an OTP array 10, which is a collection of all OTP cells sharing at least an address line. It comprises a plurality of vertically stacked horizontal address lines (word lines) 8a-8h. After the memory holes 2a-2d penetrating these horizontal address lines 8a-8h are formed, the sidewalls of the memory holes 2a-2d are covered with an antifuse layer 6a-6d before the memory holes 2a-2d are filled with at least a conductive material. The conductive material in the memory holes 2a-2d form vertical address lines (bit lines) 4a-4d.

The OTP cells 1aa-1ha on the OTP string 1A are formed at the intersections of the word lines 8a-8h and the bit line 4a. In the OTP cell 1aa, the antifuse layer 6a is a thin layer of insulating dielectric. During programming, a conductive filament 11, which has a low resistance, is irreversibly formed therein. As an example, the antifuse layer 6a comprises silicon oxide or silicon nitride. The thickness of the antifuse layer 6a is small, typically in the range of several nanometers to tens of nanometers. For reason of simplicity, except for the OTP cell 1aa, the conductive filaments in other OTP cells are not drawn.

FIG. 1B is its x-y cross-sectional view along the cutline AA'. Each of the horizontal address lines (word lines) 8a, 8a' is a conductive plate. The horizontal address line 8a is coupled with eight vertical address lines (bit lines) 4a-4h. Eight OTP cells 1aa-1ah are formed at the intersections of the horizontal address 8a and the vertical address lines 4a-4h. All OTP cells 1aa-1ah coupled with a single horizontal address line 8a form an OTP-cell set 1a. Because the horizontal address line 8a is wide, it can be formed by a low-resolution photolithography (e.g. with feature size >60 nm).

To minimize the size of the memory holes, the OTP cell of the present invention does not comprise a separate diode layer. As shown in FIG. 1C, the OTP cell 1aa comprises a separate antifuse layer 6a, but no separate diode layer. Diode is formed naturally between the horizontal address line 8a and the vertical address line 4a. Because no diode layer is formed therein, the manufacturing process of the memory hole 2a becomes simpler. In addition, smaller memory hole 2a leads to a larger storage density.

The diode formed naturally between the horizontal address line 8a and the vertical address line 4a is a built-in diode. To improve its rectifying ratio, the present invention discloses a 3D-OTP$_V$ comprising multiple antifuse sub-layers. The antifuse layer 6a of the OTP cell 1aa comprises at least a first sub-layer 6 and a second sub-layer 6'. The first sub-layer 6 and second sub-layer 6' comprise different antifuse materials. For example, the first sub-layer 6 comprises metal oxide or silicon oxide, whereas the second sub-layer 6' comprises metal nitride or silicon nitride. Using different sub-layer materials can improve the rectifying ratio of the built-in diode. Furthermore, this rectifying ratio can be further improved by making the interface of the horizontal address line 8a and the antifuse layer 6a substantially different from the interface of the vertical address line 4a and the antifuse layer 6a.

Besides using different sub-layer materials, the rectifying ratio of the built-in diode can be further improved by using different address-line materials. In a first preferred embodiment, the horizontal address line 8a comprises a P-type semiconductor material, while the vertical address line 4a comprises an N-type semiconductor material. They form a semiconductor diode. In a second preferred embodiment, the horizontal address line 8a comprises a metallic material, while the vertical address line 4a comprises a semiconductor material. They form a Schottky diode. In a third preferred embodiment, the horizontal address line 8a comprises a semiconductor material, while the vertical address line 4a comprises a metallic material. They form a Schottky diode. In a fourth preferred embodiment, the horizontal address line 8a comprises a first metallic material, while the vertical address line 4a comprises a second metallic material. The first and second metallic material are different metallic materials.

Figure 2A:
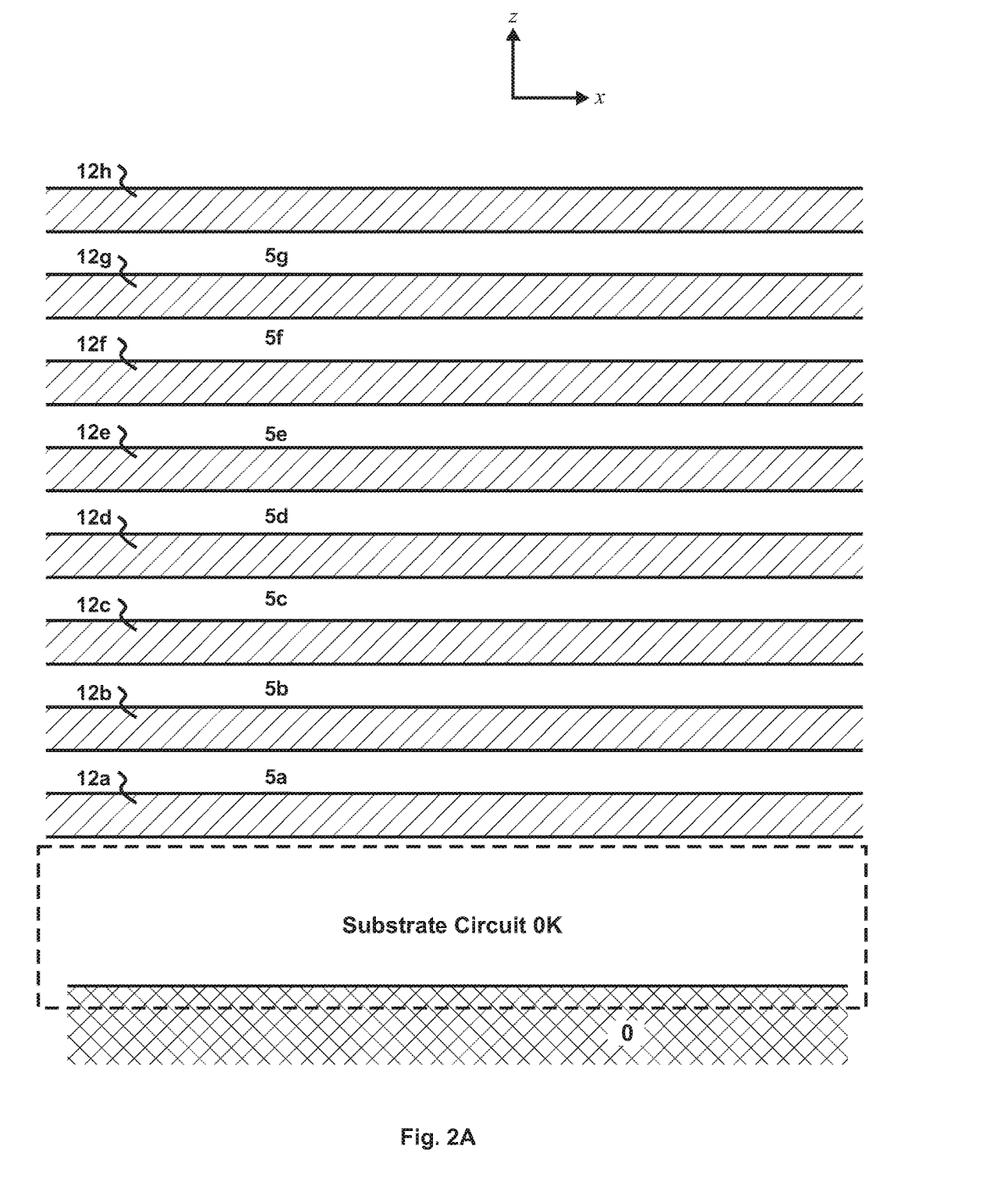
FIGS. 2A-2C are cross-sectional views of the first preferred 3D-OTP$_V$ at three manufacturing steps.
Figure 2B:
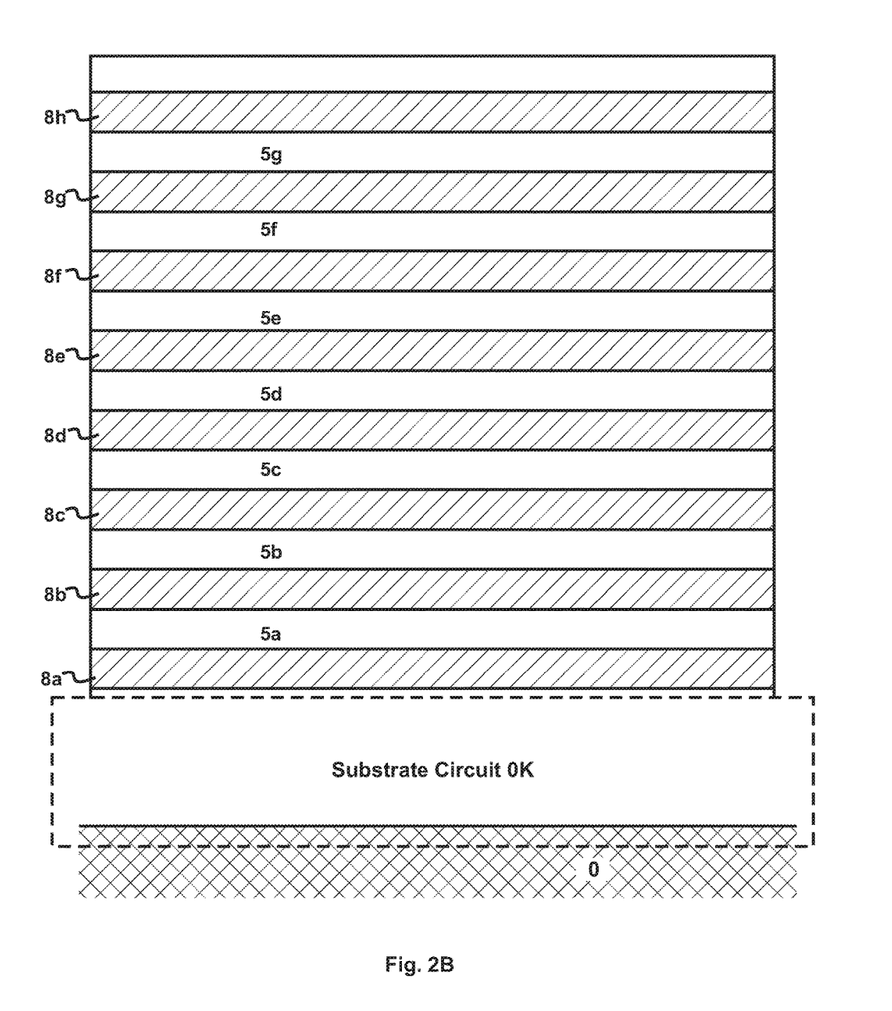
Figure 2C:
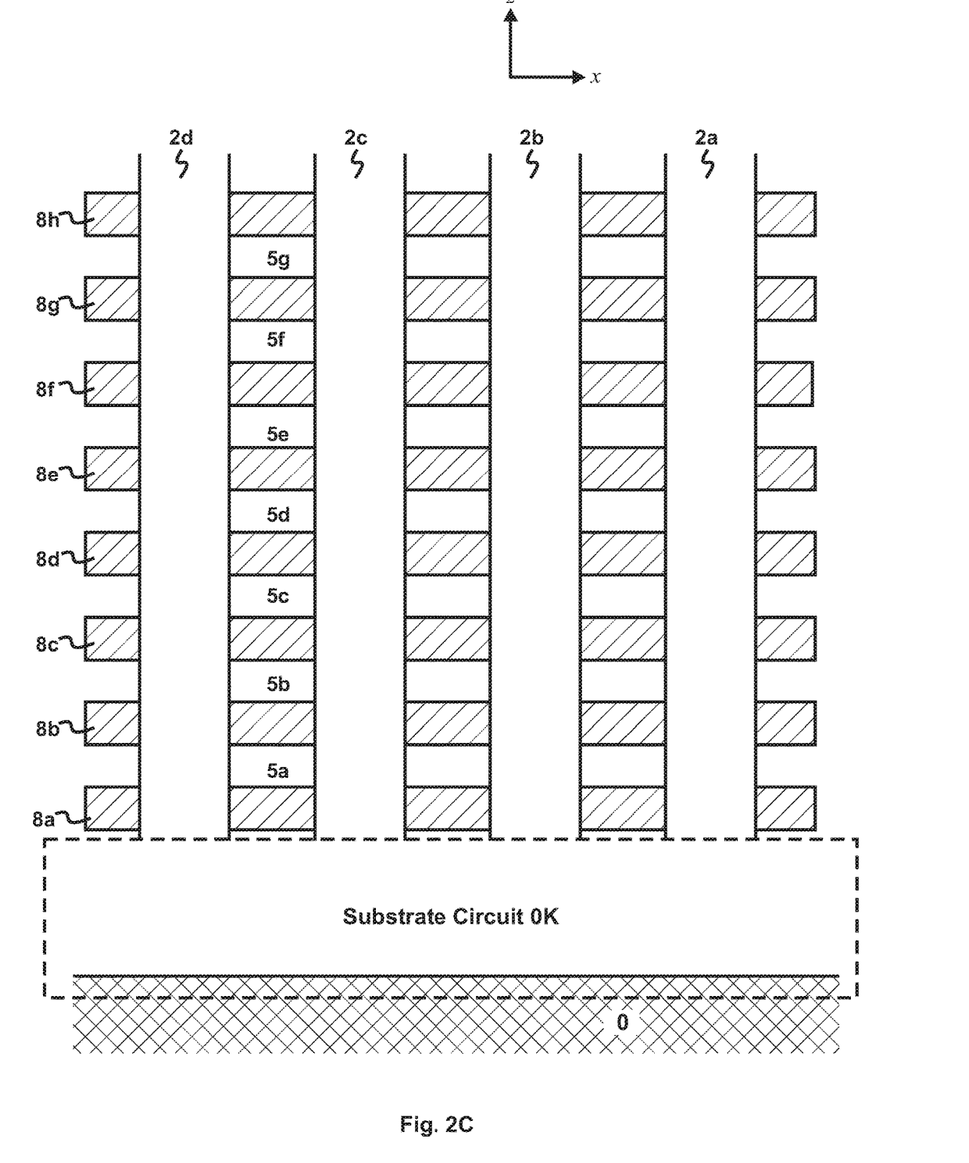

Referring now to FIGS. 2A-2C, three manufacturing steps for the preferred 3D-OTP$_V$ are shown. First of all, vertically stacked horizontal address-line layers 12a-12h are formed in continuously forming steps (FIG. 2A). To be more specific, after the substrate circuit 0K (including transistors and the associated interconnects) are planarized, a first horizontal address-line layer 12a is formed. The first horizontal address-line layer 12a is just a plain layer of conductive materials and contains no patterns. Then a first insulating layer 5a is formed on the first horizontal address-line layer 12a. Similarly, the first insulating layer 5a contains no patterns. Repeating the above process until alternate layers of the horizontal address-line layers and the insulating layers (a total of M layers) are formed. "Continuously forming steps" means that these forming steps (for the horizontal address-line layer and the insulating layer) are carried out continuously without any in-between pattern-transfer steps (including photolithography). Without any in-between pattern-transfer steps, excellent planarization can be achieve. As a result, the 3D-OTP$_V$ comprising tens to hundreds of horizontal address-line layers can be formed.

A first etching step is performed through all horizontal address-line layers 12a-12h to form a stack of horizontal address lines 8a-8h in (FIG. 2B). This is followed by a second etching step to form memory holes 2a-2d through all horizontal address lines 8a-8h (FIG. 2C). The sidewall of the memory holes 2a-2d is covered by an antifuse layers 6a-6d before the memory holes 2a-2d are filled with at least a conductive material to form the vertical address lines 4a-4d (FIG. 1A).

Figure 3A:
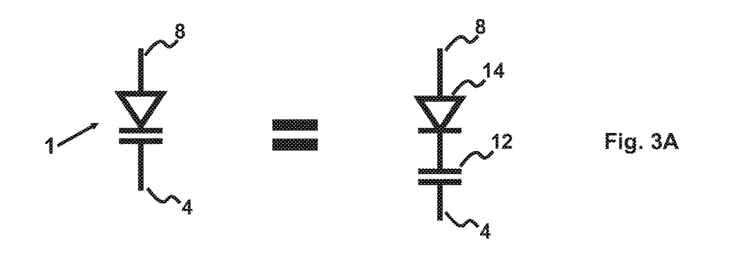
FIG. 3A is a symbol of the OTP cell.

FIG. 3A is a symbol of the OTP cell 1. The OTP cell 1, located between a word line 8 and a bit line 4, comprises an antifuse layer 12 and a diode 14. The resistance of the antifuse layer 12 can be switched from high to low or vice versa. The resistance of the diode 14 at the read voltage is substantially lower than when the applied voltage has a magnitude smaller than or polarity opposite to that of the read voltage.

Although a diode 14 is drawn in the symbol of the OTP cell 1, there is no physical diode in the present invention. The diode 14 is formed naturally between the word line 8 and the bit lines 4. This naturally formed diode 14, referred to a built-in diode, generally has a poor quality and is leaky. To address this issue, the present invention discloses a full-read mode. For the full-read mode, all OTP cells on a selected word line are read out during a read cycle.

Figure 3B:
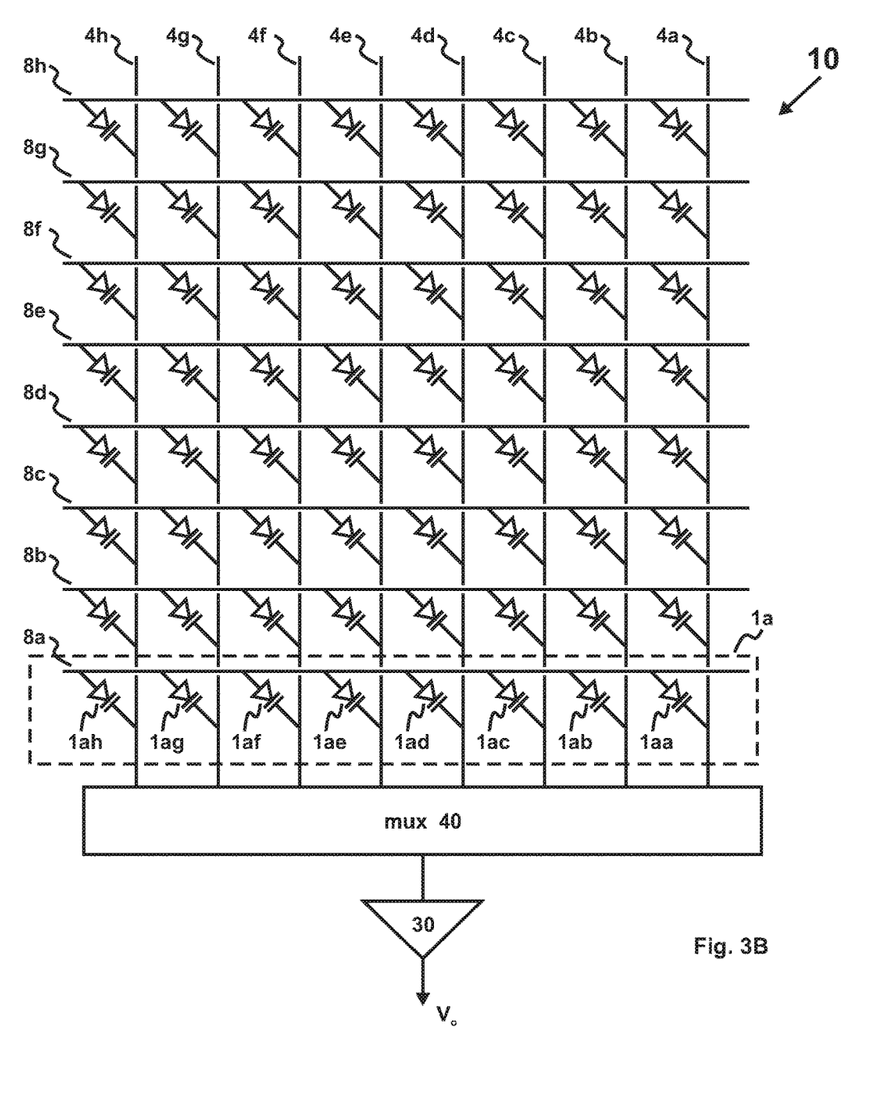
FIG. 3B is a circuit block diagram of a first preferred read-out circuit for an OTP array.

FIG. 3B discloses a first preferred read-out circuit for an OTP array 10. It runs in the full-read mode. In this preferred embodiment, the horizontal address lines 8a-8h are word lines, while the vertical address lines 4a-4h are bit lines. An OTP array 10 comprises the word lines 8a-8h, the bit lines 4a-4h, and the OTP cells 1aa-1ad . . . located at their intersections. Its peripheral circuits (located on the substrate 0 and is not part of the OTP array 10) comprise a multiplexor 40 and an amplifier 30. In this preferred embodiment, the multiplexor 40 is a 4-to-1 multiplexor.

Figure 3C:
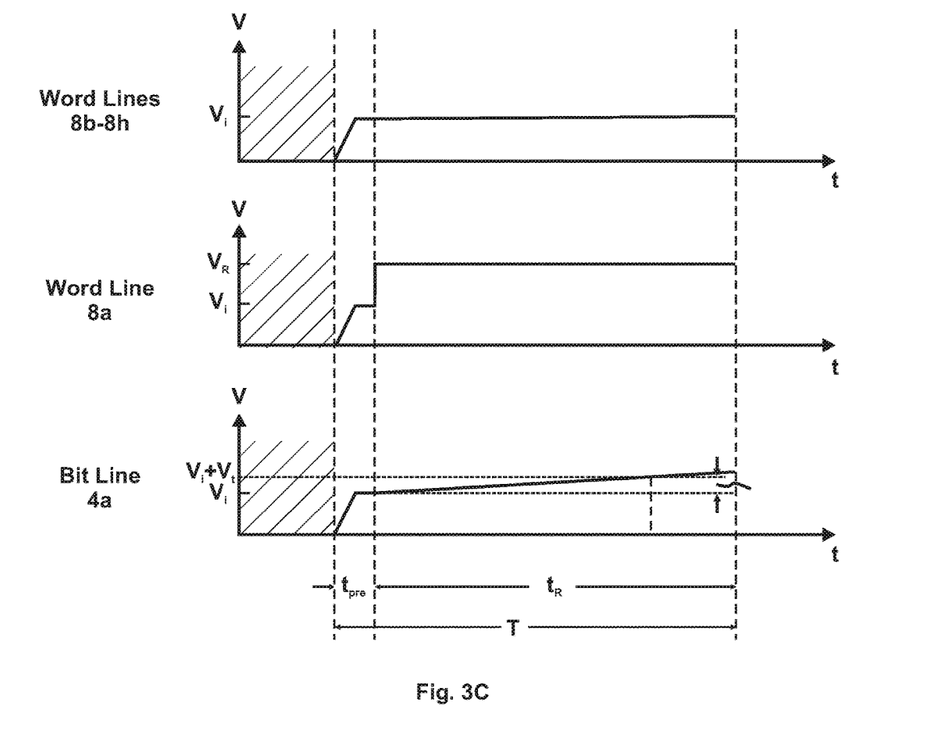
FIG. 3C is its signal timing diagram.

FIG. 3C is its signal timing diagram. A read cycle T includes two read phases: a pre-charge phase $t_{pre}$ and a read-out phase $t_R$. During the pre-charge phase $t_{pre}$, all address lines 8a-8h, 4a-4h in the OTP array 10 are charged to a pre-determined voltage (e.g. an input bias voltage $V_i$ of the amplifier 30). During the read-out phase $t_R$, all bit lines 4a-4h are floating. The voltage on a selected word line (e.g. 8a) is raised to the read voltage $V_R$, while voltage on other word lines 8b-8h remains at the input bias voltage $V_i$. After this, the selected word line 8a starts to charge all bit lines 4a-4h through the OTP cells 1aa . . . and the voltages on the bit lines 4a-4h begin to rise. The multiplexor 40 sends the voltage on each bit line (e.g. 4a) to the amplifier 30. When this voltage exceeds the threshold voltage $V_T$ of the amplifier 30, the output $V_O$ is toggled. At the end of the read cycle T, the states of all OTP cells 1aa-1ah in the OTP-cell set 1a are determined.

Figure 3D:
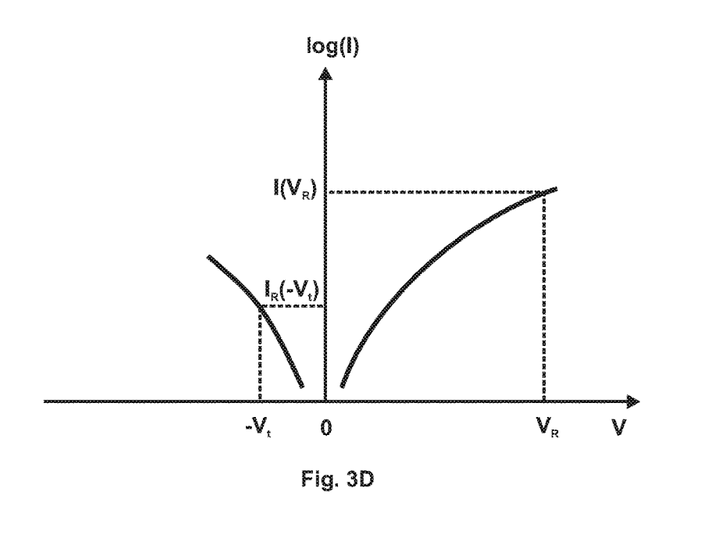
FIG. 3D shows the current-voltage (I-V) characteristic of a preferred diode layer.

FIG. 3D shows the current-voltage (I-V) characteristic of a preferred diode layer. Because the $V_T$ of the amplifier 30 is relatively small (~0.1V or smaller), the voltage changes delta(V) on the bit lines 4a-4h during the above measurement are small, i.e. delta(V)~$V_T$. The reverse voltage on the unselected OTP cells (e.g. 1ca) is ~$V_T$. As long as the I-V characteristic of the diode satisfies $I(V_R) \gg n*I(-V_T)$, the 3D-OTP$_V$ would work properly. Here, n is the number of OTP cells on a bit line (e.g. 4a). It should be noted that, because the value of $V_R$ (several volts) is far larger than that of the $-V_T$ (~0.1V), the above condition can be easily met even for leaky OTP cells.

Figure 4A:
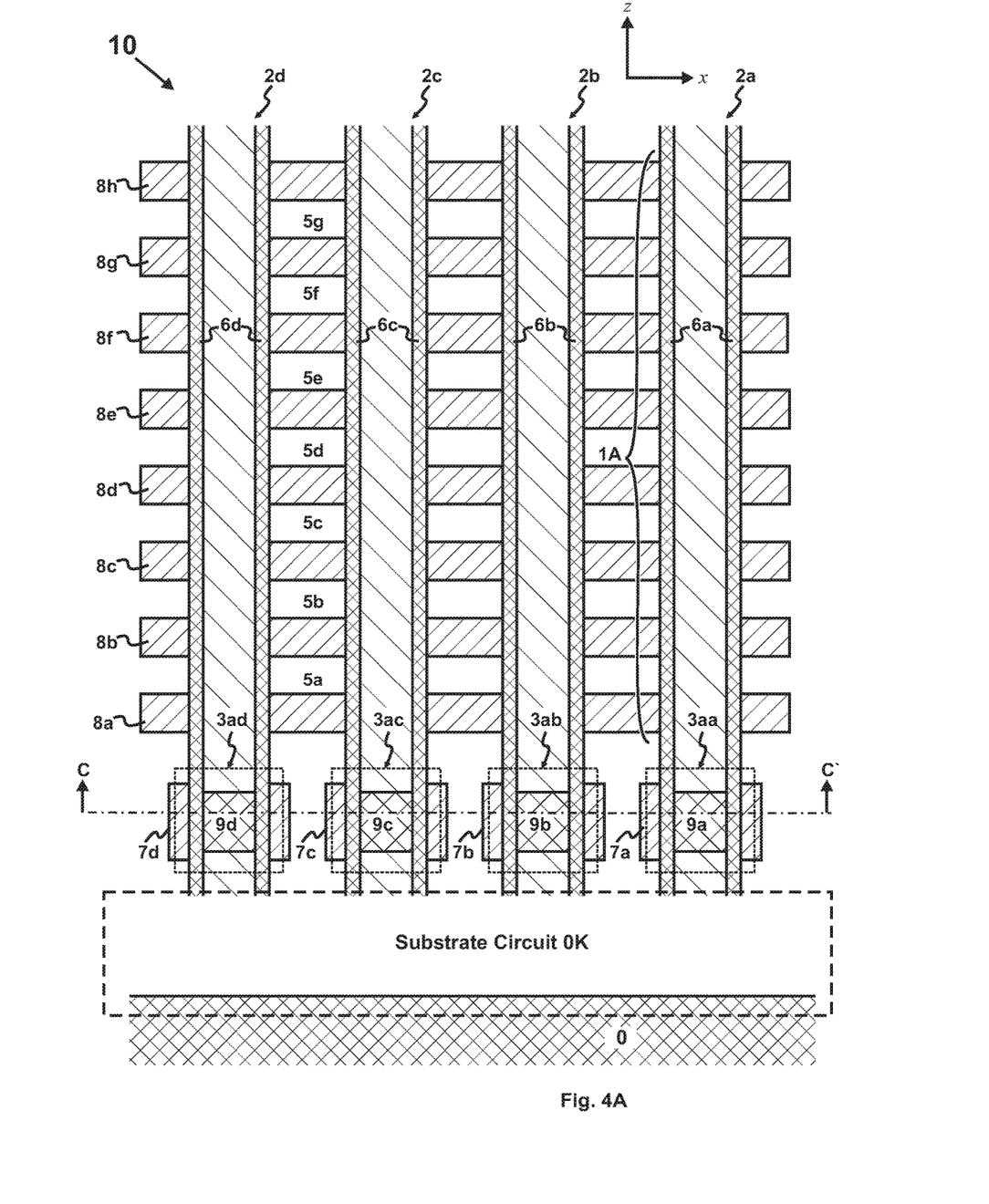
FIG. 4A is a z-x cross-sectional view of a second preferred 3D-OTP$_V$.
Figure 4B:
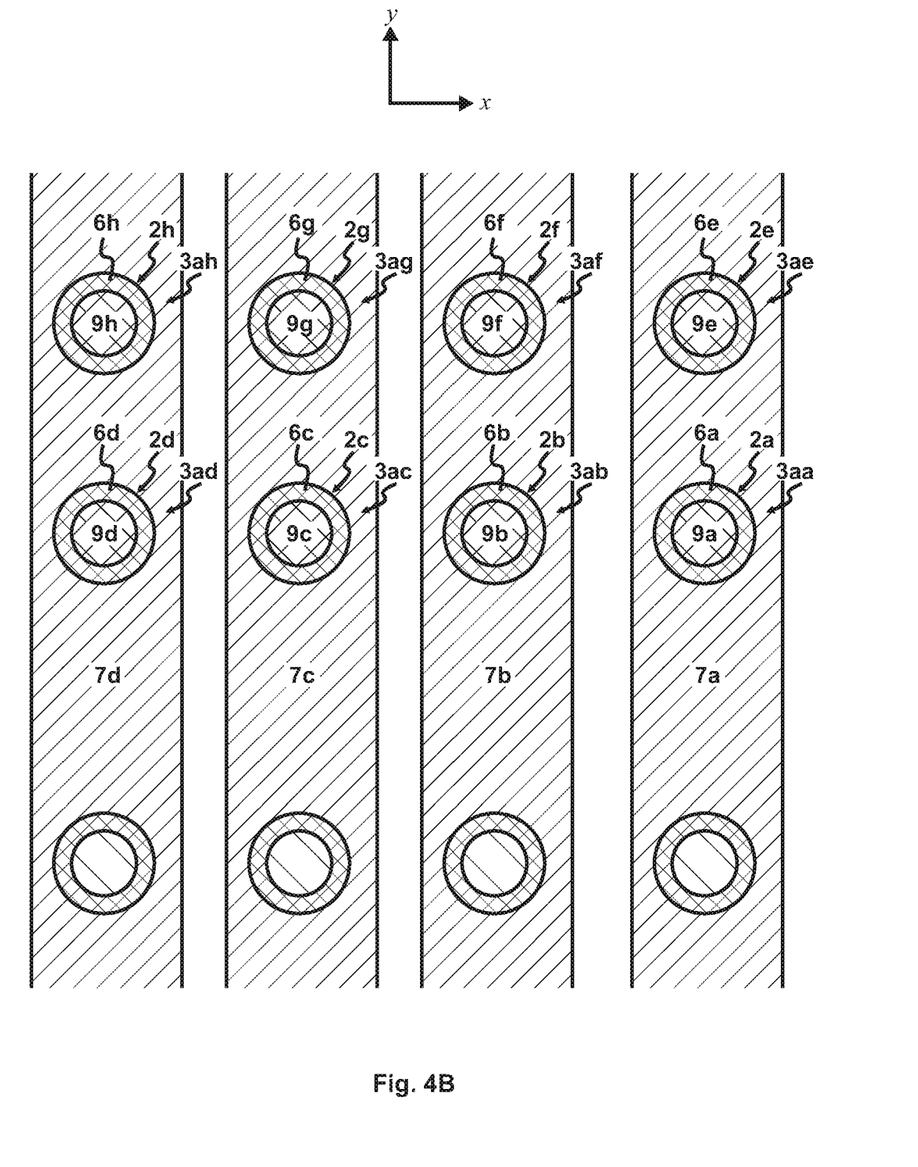
FIG. 4B is its x-y cross-sectional view along the cutline CC'.
Figure 4C:
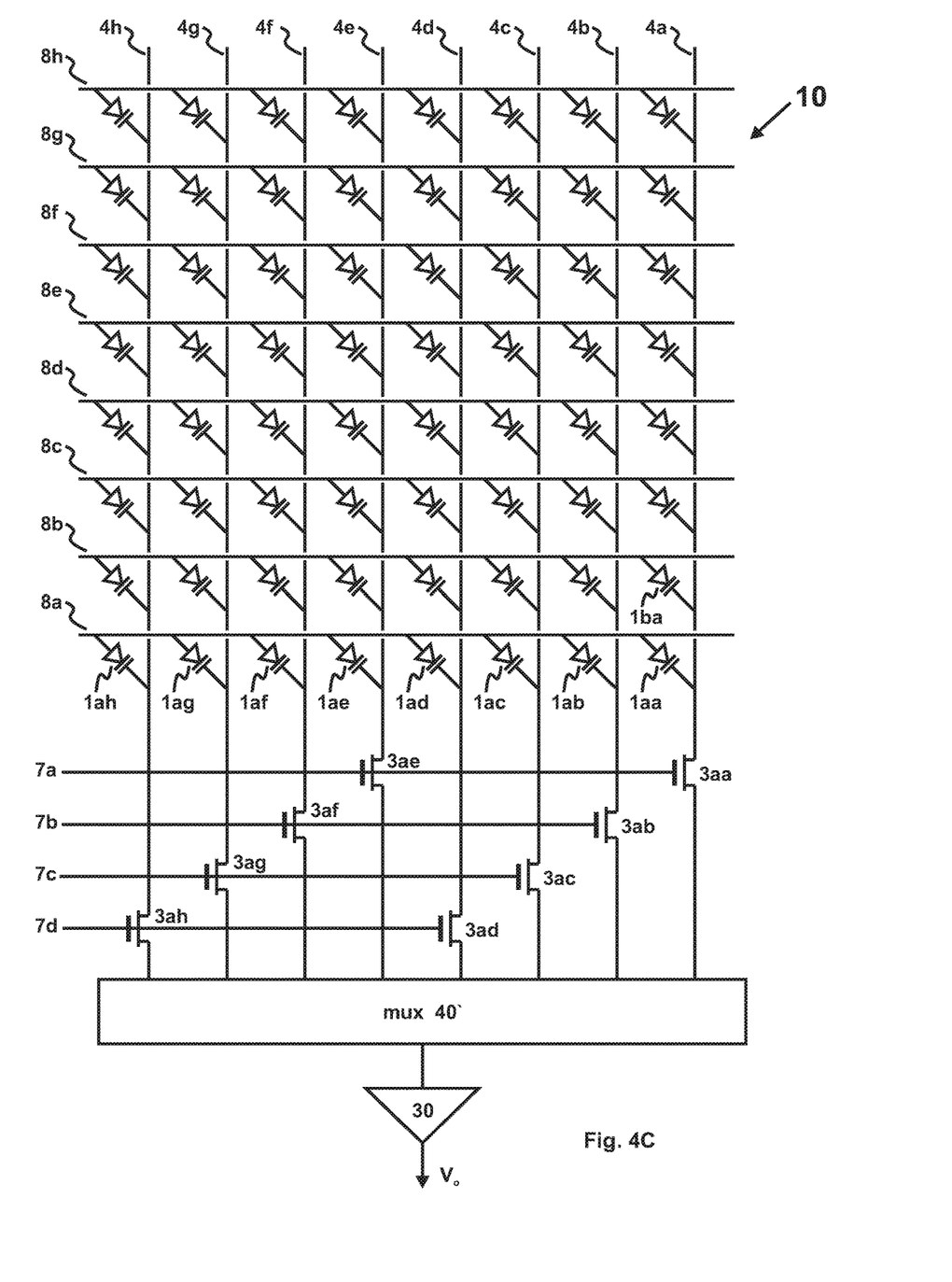
FIG. 4C is a circuit block diagram of a second preferred read-out circuit for an OTP array.

To facilitate address decoding, vertical transistors are formed on the sidewalls of the memory holes. FIGS. 4A-4C disclose a second preferred 3D-OTP$_V$ 10 comprising vertical transistors 3aa-3ad. The vertical transistor 3aa is a pass transistor comprising a gate 7a, a gate dielectric 6a and a channel 9a (FIG. 4A). The channel 9a is formed in the semiconductor material filled in the memory hole 2a. Its doping could be same as, lighter than, or opposite to that of the vertical address line 4a. The gate 7a surrounds the memory holes 2a, 2e and controls the pass transistors 3aa, 3ae (FIG. 4B); the gate 7b surrounds the memory holes 2b, 2f and controls the pass transistors 3ab, 3af; the gate 7c surrounds the memory holes 2c, 2g and controls the pass transistors 3ac, 3ag; the gate 7d surrounds the memory holes 2e, 2h and controls the pass transistors 3ae, 3ah. The pass transistors 3aa-3ah form at least a decoding stage (FIG. 4C). In one preferred embodiment, when the voltage on the gate 7a is high while the voltages on the gates 7b-7d are low, only the pass transistors 3aa, 3ae are turned on, with other pass transistors off. The substrate multiplexor 40' is a 2-to-1 multiplexor which selects a signal from the bit lines 4a, 4e. By forming vertical transistors 3aa-3d in the memory holes 2a-2d, the decoder design could be simplified.

While illustrative embodiments have been shown and described, it would be apparent to those skilled in the art that many more modifications than that have been mentioned above are possible without departing from the inventive concepts set forth therein. The invention, therefore, is not to be limited except in the spirit of the appended claims.

What is claimed is:

1. A three-dimensional vertical one-time-programmable memory (3D-OTP$_V$), comprising:

a semiconductor substrate comprising a substrate circuit;

a plurality of vertically stacked horizontal address lines above said semiconductor circuit, wherein said horizontal address lines comprise at least a first conductive material;

a plurality of memory holes through said horizontal address lines;

an antifuse layer on the sidewalls of said memory holes, said antifuse layer comprising at least first and second sub-layers, wherein said first and second sub-layers comprise different antifuse materials;

a plurality of vertical address lines in said memory holes and in contact with said anitfuse layer, wherein said vertical address lines comprise at least a second conductive material;

a plurality of OTP cells at the intersections of said horizontal and vertical address lines, wherein each of said OTP cells comprises at least a first portion of a first selected one of said horizontal address lines, at least a second portion of a second selected one of said vertical address lines, and at least a third portion of said antifuse layer;
wherein said horizontal and vertical address lines are separated by said antifuse layer only.

2. The 3D-OTP$_V$ according to claim 1, wherein said first sub-layer comprises at least a metal oxide or silicon oxide, and second sub-layer comprise at least a metal nitride or silicon nitride.

3. The 3D-OTP$_V$ according to claim 1, further comprising:
a first interface between said first sub-layer and selected one of said horizontal address lines;
a second interface between said second sub-layer and selected one of said vertical address lines;
wherein said first and second interfaces are different.

4. The 3D-OTP$_V$ according to claim 1, wherein said first and second conductive materials are different conductive materials.

5. The 3D-OTP$_V$ according to claim 1, wherein said horizontal address line, said antifuse layer and said vertical address line form a built-in diode.

6. The 3D-OTP$_V$ according to claim 5, wherein the resistance of said diode is substantially lower than when the applied voltage has a magnitude smaller than or a polarity opposite to that of the read voltage.

7. The 3D-OTP$_V$ according to claim 6, wherein all OTP cells coupled to a selected horizontal address line are read out in a single read cycle.

8. The 3D-OTP$_V$ according to claim 7, wherein the I-V characteristics of said built-in diode satisfies $|(V_R)>>n*I(-V_T)$, where $V_R$ is the read voltage on said selected horizontal address line; $V_T$ is the toggle voltage of a selected vertical address line; n is the number of OTP cells on said selected horizontal address line.

9. The 3D-OTP$_V$ according to claim 1, wherein said OTP cells form an OTP string.

10. The 3D-OTP$_V$ according to claim 9, further comprising a vertical transistor coupled to said OTP string.

11. The 3D-OTP$_V$ according to claim 10, wherein said vertical transistor is formed in a first portion of said memory hole, and said OTP string is formed in a second portion of said memory hole.

* * * * *